(12) United States Patent
Jung

(10) Patent No.: US 8,451,660 B2
(45) Date of Patent: May 28, 2013

(54) SEMICONDUCTOR MEMORY DEVICE AND METHOD OF MANUFACTURING THE SAME

(75) Inventor: Jin Hyo Jung, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 165 days.

(21) Appl. No.: 12/978,865

(22) Filed: Dec. 27, 2010

(65) Prior Publication Data

US 2012/0155176 A1 Jun. 21, 2012

(30) Foreign Application Priority Data

Dec. 17, 2010 (KR) ........................ 10-2010-0130133

(51) Int. Cl.
*G11C 16/04* (2006.01)
(52) U.S. Cl.
USPC ................................ 365/185.18; 365/185.05
(58) Field of Classification Search
USPC ............................ 365/185.18, 185.05, 185.26
See application file for complete search history.

(56) References Cited

U.S. PATENT DOCUMENTS 6,215,701 B1 *  4/2001  Yao et al. ................. 365/185.18
8,000,137 B2 *  8/2011  Ogura et al. ............. 365/185.05

FOREIGN PATENT DOCUMENTS

KR   10-2011-0000941   6/2011

* cited by examiner

*Primary Examiner* — Vu Le
(74) *Attorney, Agent, or Firm* — Sherr & Jiang, PLLC

(57) ABSTRACT

A semiconductor memory device and a method of manufacturing the same. The semiconductor memory device includes a first conductive type well and a second conductive type well disposed on and/or over a semiconductor substrate; a first gate and a second gate disposed on and/or over the first conductive type well and the second conductive type well, respectively; a second conductive type first ion implantation region disposed in the first conductive type well at one side of the first gate and a second conductive type second ion implantation region disposed in the first conductive type well at the other side of the first gate; a first conductive type first ion implantation region disposed in the second conductive type well at one side of the second gate and a first conductive type second ion implantation region disposed in the second conductive type well at the other side of the second gate; and a line electrically connecting the second conductive type second ion implantation region with the first conductive type first ion implantation region.

18 Claims, 10 Drawing Sheets

US 8,451,660 B2

SEMICONDUCTOR MEMORY DEVICE AND METHOD OF MANUFACTURING THE SAME

CROSS-REFERENCE TO RELATED APPLICATIONS

This application claims priority under 35 U.S.C. §119 to Korean Patent Application No. 10-2010-0130133, filed Dec. 17, 2010, which is hereby incorporated by reference in its entirety.

BACKGROUND

The present disclosure relates to a semiconductor memory device and a method of manufacturing the same.

Generally, a semiconductor memory device such as Erasable Programmable Read Only Memory (EPROM) may have a multi-poly structure (in which a floating gate, an Oxide-Nitride-Oxide (ONO) layer, and a control gate are stacked). Presently, however, research is in progress on a single gate structure having advantages such as simple manufacturing processes and operation excellence.

FIG. 1 is a view illustrating a form of an applied voltage when a semiconductor memory device of a single gate structure is programmed. Hereinafter, a semiconductor memory device described below is regarded as EPROM.

The semiconductor memory device is programmed through a hot channel electron injection method. Once a program voltage +Vp is applied to N-well 10 (also serves as a control gate), a specific voltage is induced by a coupling ratio of two floating gates 20.

A voltage induced in floating gate 20 reverse an electric potential of a channel region in NMOS 30, and once a predetermined voltage VDS is applied to drain 31 of NMOS 30, a current flows from drain 31 to source 32.

Accordingly, hot channel electrons generated around a junction region of drain 31 may be injected into floating gate 20 so that a threshold voltage of NMOS 30 may become higher.

FIG. 2 is a view illustrating a form of an applied voltage when a semiconductor memory device of a typical single gate structure reads data.

Once a reading voltage +VR is applied to N-well 10, a specific voltage is induced in floating gate 20. Additionally, a positive drain voltage for a read operation is applied to drain 31 of NMOS 30 and source 32 is connected to a reference voltage. The reference voltage may include a ground (GND) or 0 Voltage, but is not limited thereto.

If electrons are injected to floating gate 20 and a threshold voltage of NMOS 30 is in a high program state, a specific voltage induced in floating gate 20 cannot turn on the NMOS so that no current flows.

Moreover, if electrons flow out from floating gate 20 and a threshold voltage of NMOS 30 is in a low erase state, a specific voltage induced in floating gate 20 turns on the NMOS so that currents flows. Thus, according to each case, data may be read.

In the semiconductor memory device of the typical single gate structure, NMOS 30 is formed so that P-well 40 where a program/read operation is performed is electrically connected to a semiconductor substrate.

Accordingly, although not shown in the drawings, a predetermined circuit device is realized in another region of the semiconductor substrate, and at this point, if the semiconductor substrate is biased to a specific negative electric potential, it may not operate.

When the semiconductor substrate is biased to a negative electric potential, in order to operate the semiconductor memory device of a single gate structure, a deep N-well separating the P-well from the semiconductor substrate may be formed.

Since the N-well 10, however, which serves as a word line of the semiconductor memory device of the single gate structure needs to be separated again from the deep N-well, it is difficult to realize the semiconductor memory device and its operations become unstable.

Furthermore, since N-well 10 serves as a control gate inducing the floating gate 20 to a specific electric potential, it needs to be separated from N-well 10 in a direction of the bit line (connected to drain 31 of NMOS 30).

Accordingly, a cell size of the semiconductor memory device becomes greater and it is difficult to apply the semiconductor memory device to a mass storage device.

SUMMARY

Embodiments relate to a semiconductor memory device and a method of manufacturing the same adapted to operate stably in a low voltage environment and which minimizes a cell size and a size of a peripheral circuit region.

In accordance with embodiments, a semiconductor memory device may include at least one of the following: a first conductive type well and a second conductive type well disposed on and/or over a semiconductor substrate; a first gate and a second gate disposed on and/or over the first conductive type well and the second conductive type well, respectively; a second conductive type first ion implantation region disposed in the first conductive type well at one side of the first gate; a second conductive type second ion implantation region disposed in the first conductive type well at the other side of the first gate; a first conductive type first ion implantation region disposed in the second conductive type well at one side of the second gate; a first conductive type second ion implantation region disposed in the second conductive type well at the other side of the second gate; and a line connecting the second conductive type second ion implantation region with the first conductive type first ion implantation region electrically.

In accordance with embodiments, a method of manufacturing a semiconductor memory device may include at least one of the following: forming a first conductive type well and a second conductive type well on and/or over a semiconductor substrate; forming a first gate and a second gate on and/or over the first conductive type well and the second conductive type well, respectively; forming a second conductive type first ion implantation region in the first conductive type well at one side of the first gate and a second conductive type second ion implantation region in the first conductive type well at the other side of the first gate; forming a first conductive type first ion implantation region in the second conductive type well at one side of the second gate and a first conductive type second ion implantation region in the second conductive type well at the other side of the second gate; and forming a line connecting the second conductive type second ion implantation region with the first conductive type first ion implantation region electrically.

DRAWINGS

Figure 1:
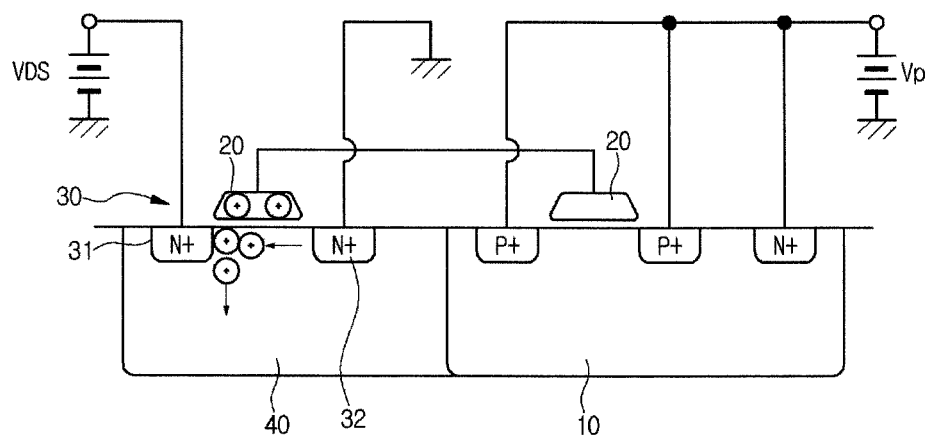
FIG. 1 illustrates a form of an applied voltage when a semiconductor memory device of a single gate structure is programmed.
Figure 2:
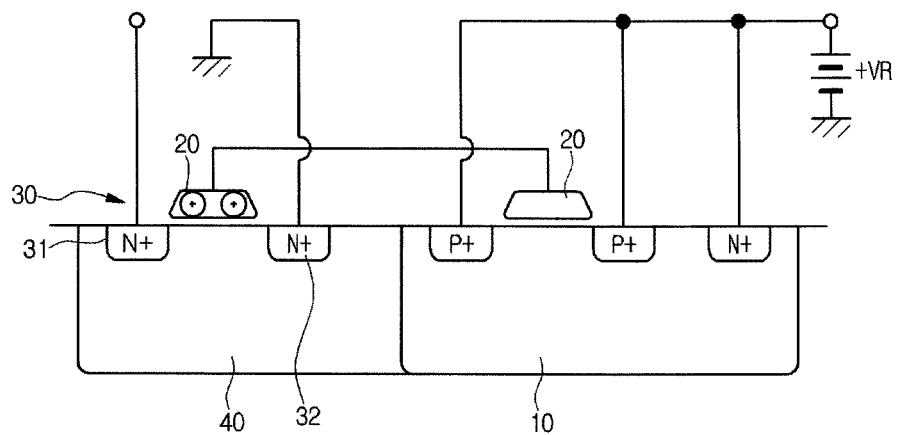
FIG. 2 illustrates a form of an applied voltage when a semiconductor memory device of a typical single gate structure reads data.
Figure 3:
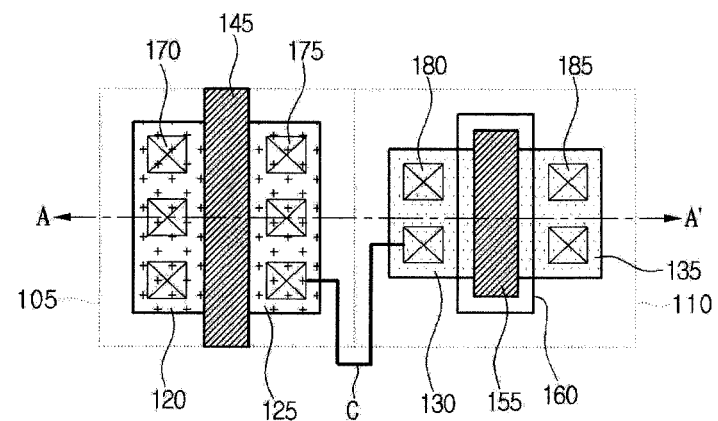

Example FIG. 3 is a plan view illustrating a structure of a semiconductor memory device, in accordance with embodiments.

Figure 4:
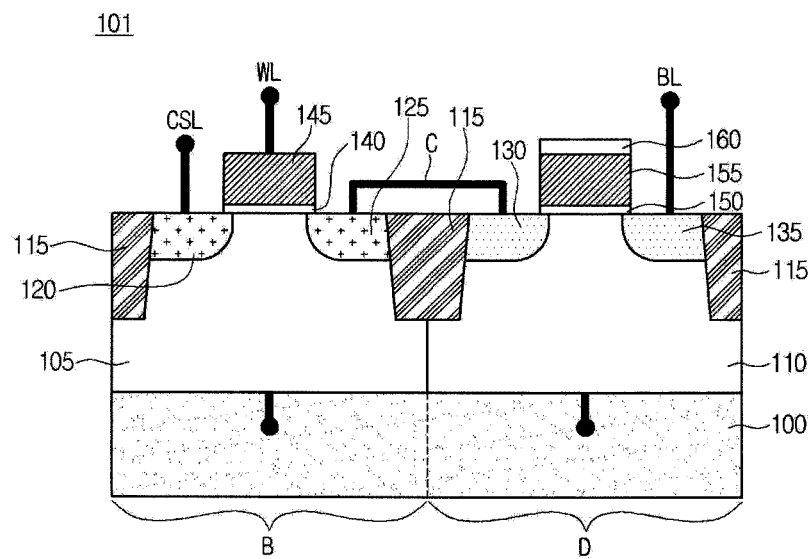

Example FIG. 4 is a cross-sectional view illustrating a structure of a semiconductor memory device taken along line A-A' of example FIG. 3, in accordance with embodiments.

Figure 5:
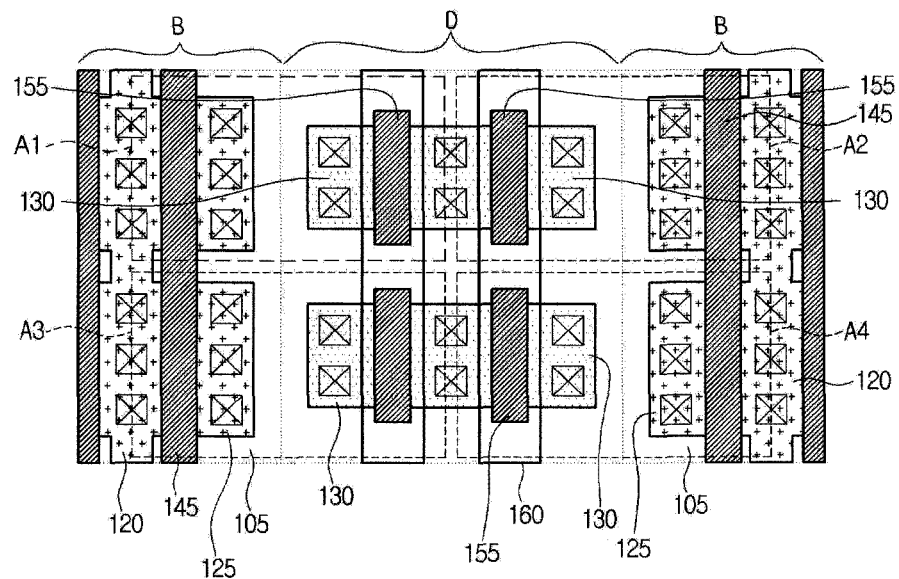

Example FIG. 5 is a plan view when unit cells A of a semiconductor memory device constitute an array, in accordance with embodiments.

Figure 6:
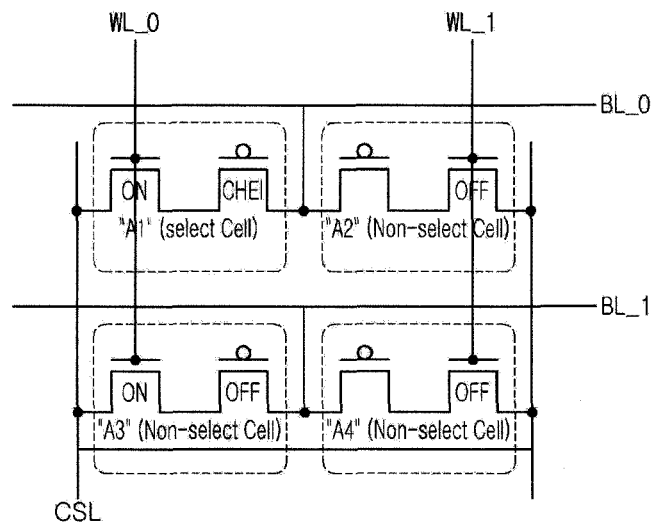

Example FIG. 6 is a circuit diagram of an equivalent circuit when a semiconductor memory device includes of a four bit cell, in accordance with embodiments.

Figure 7:
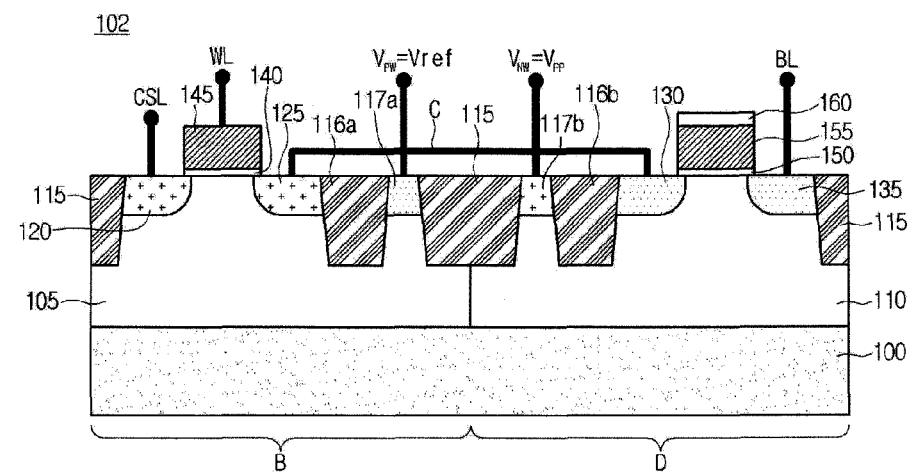

Example FIG. 7 is a cross-sectional view of a structure of a semiconductor memory device, in accordance with embodiments.

Figure 8:
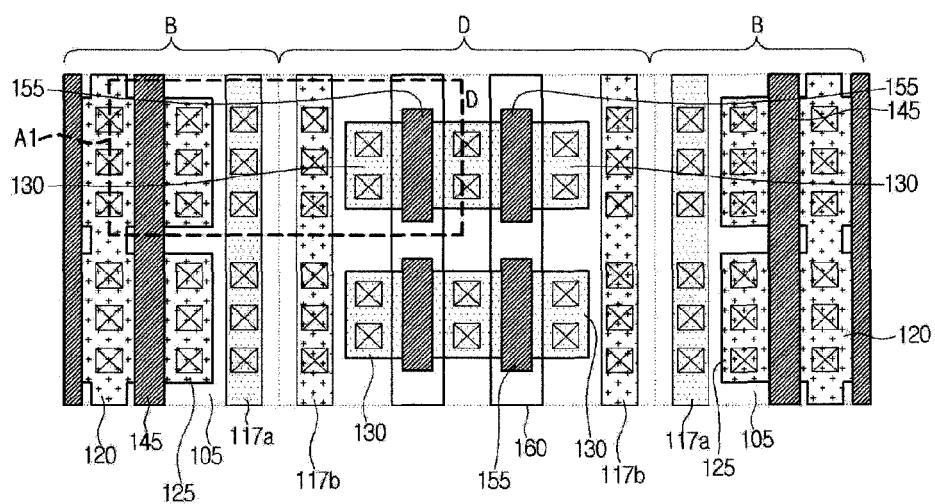

Example FIG. 8 is a plan view when unit cells of the semiconductor memory device illustrated in example FIG. 7 constitute an array, in accordance with embodiments.

Figure 9:
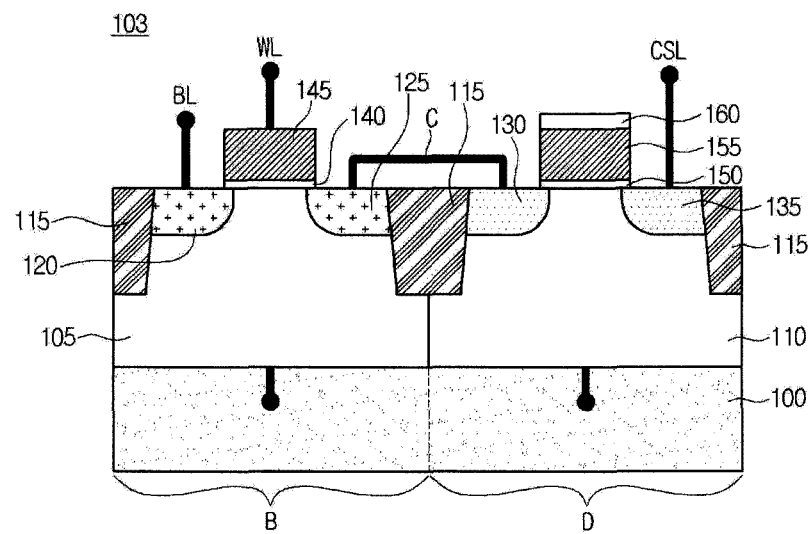

Example FIG. 9 is a cross-sectional view of a structure of a semiconductor memory device, in accordance with embodiments.

Figure 10:
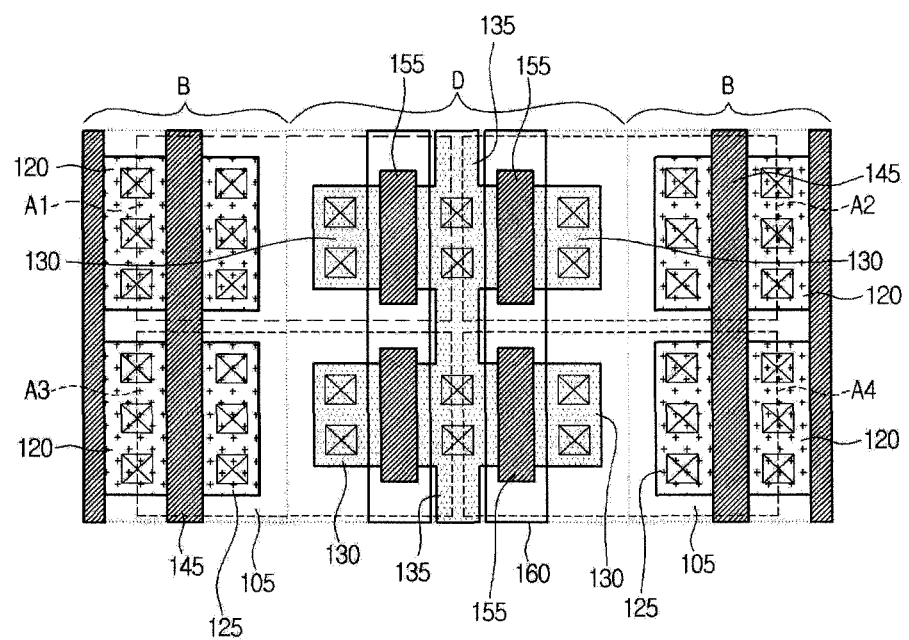

Example FIG. 10 is a plan view when unit cells of the semiconductor memory device illustrated in example FIG. 9 constitute an array, in accordance with embodiments.

Figure 11:
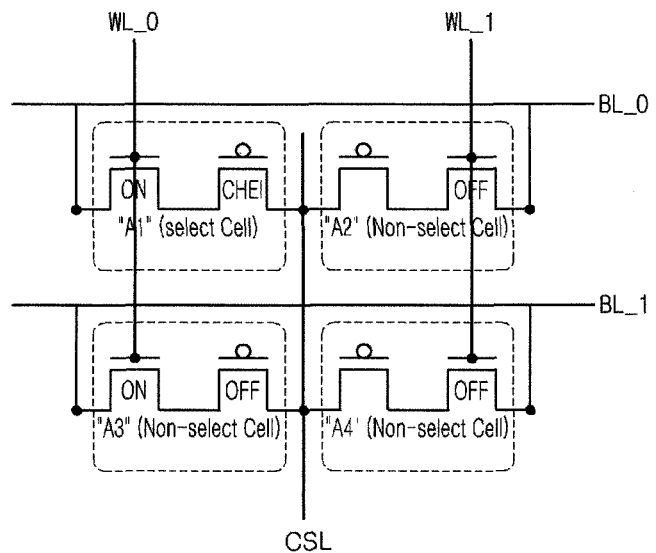

Example FIG. 11 is a circuit diagram of an equivalent circuit when a semiconductor memory device illustrated in example FIG. 10 includes a four bit cell, in accordance with embodiments.

Figure 12:
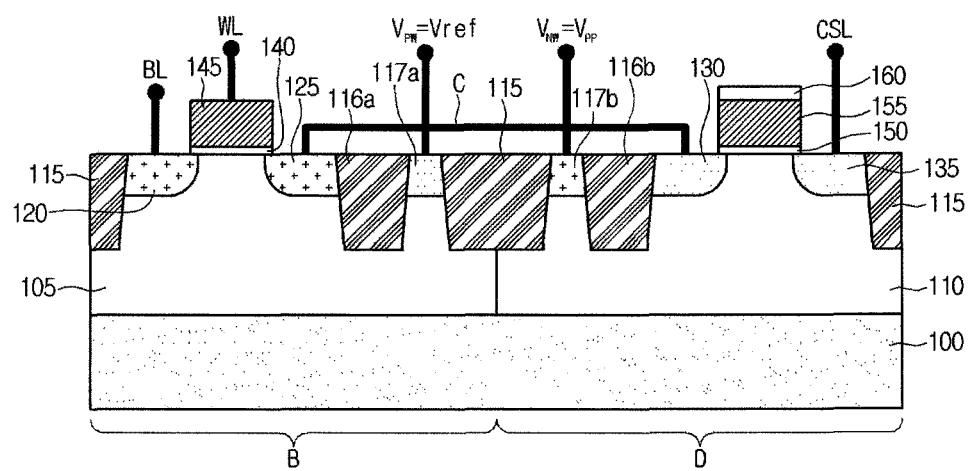

Example FIG. 12 is a cross-sectional view of a structure of a semiconductor memory device in accordance with embodiments.

Figure 13:
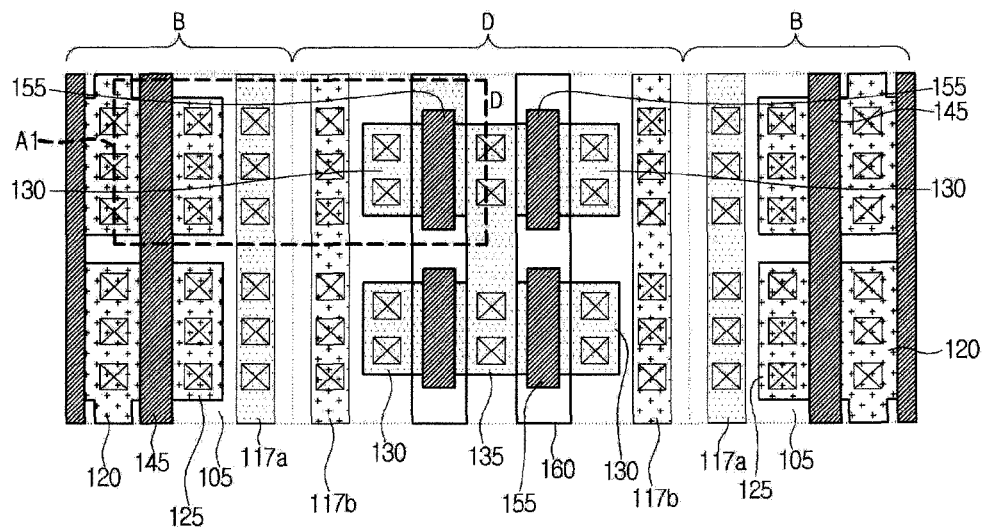

Example FIG. 13 is a plan view when unit cells of the semiconductor memory device illustrated in example FIG. 12 constitute an array, in accordance with embodiments.

Example FIGS. 14 through 23 are process sectional views of a method of manufacturing a semiconductor memory device in accordance with embodiments.

DESCRIPTION

Hereinafter, a semiconductor memory device and a method of manufacturing the same in accordance with embodiments will be described with reference to the accompanying drawings.

In the description of embodiments, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being "between" two layers, it can be the only layer between the two layers, or one or more intervening layers may also be present.

Example FIG. 3 illustrates a structure of a semiconductor memory device in accordance with embodiments. Example FIG. 4 illustrates a structure of a semiconductor memory device taken along line A-A' of example FIG. 3.

Hereinafter, semiconductor memory device 101 in accordance with embodiments will described with reference to example FIGS. 3 and 4 and can be Erasable Programmable Read Only Memory (EPROM). Additionally, the semiconductor memory device may be a semiconductor memory device, but is not limited thereto. In example FIGS. 3 and 4, only a unit cell region of the semiconductor memory device in accordance with embodiments.

As illustrated in example FIGS. 3 and 4, semiconductor memory device 101 in accordance with embodiments can include semiconductor substrate 100, first conductive type well 105, second conductive type well 110, device isolation region 115, second conductive type first ion implantation region 120, second conductive type second ion implantation region 125, first gate insulation layer 140, first gate 145, first conductive type first ion implantation region 130, first conductive type second ion implantation region 135, second gate insulation layer 150, second gate 155, salicide blocking layer 160, first tap 170, second tap 175, third tap 180, and fourth tap 185.

Hereinafter, for convenience of description, first conductive type well 105, second conductive type well 110, second conductive type first ion implantation region 120, second conductive type second ion implantation region 125, first conductive type first ion implantation region 130, and first conductive type second ion implantation region 135 are referred to as P well 105, N well 110, N source region 120, N drain region 125, P drain region 130, and P source region 135, respectively.

As described below, the first conductive type means a P type and the second conductive type means an N type but their opposite types are also possible.

The semiconductor memory device can be divided into a first region B of a select second conductive type MOS transistor, (i.e., a select NMOS TR) and a second region D of a floating first conductive type MOS transistor (i.e., a floating PMOS TR).

P well 105 and N well 110 are formed side by side on and/or over semiconductor substrate 100, e.g., P type sub substrate. P well 105 and N well 110 may be formed at the same depth. P well 105 and N well 110 may be spaced from each other by device isolation region 115. Device isolation region 115 can completely separate P well 105 from N well 110. Alternatively, device isolation region 115 can separate only some upper portions thereof, as illustrated in example FIG. 4. P well 105 becomes a base layer constituting first region B and N well 110 becomes a base layer constituting the second region D.

Second gate insulation layer 140 is formed on and/or over semiconductor substrate 100 having P well 105. First gate 145 is formed on and/or over second gate insulation layer 140. N source region 120 is formed on and/or over P well 105 at one side of first gate 145 and N drain region 125 is formed on and/or over P well 105 at the other side of first gate 145. Second gate insulation layer 150 is formed on and/or over semiconductor substrate 100 having N well 110. Second gate 155 is formed on and/or over second gate insulation layer 150. P drain region 130 is formed on and/or over N well 110 at one side of second gate 155 and P source region 135 is formed on and/or over N well 110 at the other side of second gate 155.

In this manner, the select NMOS TR of first region B and floating PMOS TR of second region D are formed and also it is apparent that a structure such as a Lightly doped drain (LDD) region, a sidewall, and a spacer may be further included in each transistor region.

Salicide block layer 160 is formed on and/or over second gate 155 and prevents silicide from being formed on and/or over second gate 155. N drain region 125 and P drain region 130 are spaced from each other by device isolation region 115. First tap 170, second tap 175, third tap 180, and fourth tap 185 are formed on and/or over N source region 120, N drain region 125, P drain region 130, and P source region 135, respectively, and can be used as terminal or a bonding pad, which is used as an electrode when a voltage is applied.

Hereinafter, a program operation and a read operation of the semiconductor memory device will be described as follows.

N source region 120 is connected to a Common Source Line (CSL) and N drain region 125 is connected to P drain region 130 through an additional line C. First gate 145 is connected to a word line WL, second gate 155 floats, and P source region 135 is connected to bit line BL. Accordingly, a unit cell of the semiconductor memory device has a structure in which the select NMOS TR of first region B and floating PMOS TR of second region D are connected in series.

When a unit cell of the semiconductor memory device is programmed, first voltage Vpp of positive electric potential, i.e., a positive program voltage, is applied to P source region 135 and N well 110 connected to the bit line, and also, second voltage Vwlp of positive electric potential, i.e., a word line program voltage, is applied to first gate 145 connected to word line WL. N source region 120 connected to the common source line and P well 105 are connected to a reference voltage. The reference voltage may include a ground (GND) or 0 Voltage, but embodiments are not limited thereto.

A first coupling capacitance exists between second gate 155 and P drain region 130, a second coupling capacitance exists between second gate 155 and P source region 135, and a third coupling capacitance exists between a channel region (between P drain region 130 and P source region 135) and second gate 155. In accordance with this bias condition, a predetermined third voltage of positive electric potential, i.e., a positive voltage, occurs by the first voltage applied to N well 110 and P source region 135.

Due to influence of the third voltage, floating PMOS TR of second region D is turned on and select NMOS TR of first region B is turned on by the second voltage, so that a current flows from P source region 135 (i.e., the bit line) to N source region 120 (i.e., the common source line). In this manner, if select NMOS TR of first region B and floating PMOS TR of second region D are turned on simultaneously, a Channel Hot Electron Injection (CHEI) phenomenon occurs around P source region 135 of floating PMOS TR, and electrons are additionally injected on and/or over second gate 155. Consequently, a threshold voltage of floating PMOS TR becomes lowered and floating PMOS TR is turned on more strongly so that the CHEI phenomenon continues and the threshold voltage of floating PMOS TR may be continuously lowered. Accordingly, as a programming time of the semiconductor memory device is increased, a phenomenon that a threshold voltage of floating PMOS TR of second region D becomes lowered may be induced. Accordingly, the semiconductor memory device may be programmed.

Additionally, if a unit cell of the semiconductor memory device is read, fourth voltage Vpr of positive potential, i.e., a positive reading voltage, is applied to P source region 135 connected to the bit line and N well 110. Fifth voltage Vwlr of positive electric potential, i.e., a word line reading voltage, is applied to first gate 145 connected to the word line. N source region 120 connected to the common source line and P well 105 are connected to a connected to a reference voltage. The reference voltage may include a ground (GND) or 0 Voltage, but embodiments are not limited thereto. At this point, fourth voltage Vpr needs to be lower than first voltage Vpp.

When the semiconductor memory device is read, the first coupling capacitance, the second coupling capacitance, and the third coupling capacitance operate, and in accordance with this bias condition, by the fourth voltage applied to N well 110 and P source region 135, a sixth voltage of positive electric potential, i.e., a positive voltage, occurs on and/or over second gate 155.

First, when floating PMOS TR of second region D is in a programmed state, i.e., electrons are injected into second gate 155, as mentioned above, floating PMOS TR is turned on since its threshold voltage is very low and select NMOS TR is turned on by the fifth voltage also. Accordingly, since current flows from P source region 135 (i.e., the bit line) to N source region 120 (i.e., the common source line) and the current of the bit line is read, it is determined that the semiconductor memory device is in a programmed state (e.g., "1").

Second, if floating PMOS TR of second region D is in an un-programmed state, i.e., an initial state of when electrons are not injected into second gate 155, floating PMOS TR is turned off since its threshold voltage is high and current does not flow from the bit line to the common source line. Accordingly, by reading a short circuit state of the bit line, it is determined that the semiconductor memory device is in an un-programmed state (e.g., "0").

For reference, when the semiconductor memory device is read, sizes of the first voltage and the fourth voltage may not be limited to a predetermined value but the above condition that the fourth voltage may be applied lower than the first voltage.

Example FIG. 5 illustrates when unit cells A of a semiconductor memory device in accordance with embodiments constitute an array.

As illustrated in example FIG. 5, unit cells A1, A2, A3, and A4 of the semiconductor memory device are provided in four and may include a 2×2 matrix for 4 bit cells. First unit cell A1 and second unit cell A2 adjacent on an X axis of the four bit cells and third unit cell A3 and fourth unit cell A4 have a symmetric structure facing each other. First unit cell A1 and third unit cell A3 adjacent on a Y axis and second unit cell A2 and fourth unit cell A4 have a structure in which they are arranged in parallel. First unit cell A1 is electrically connected to N source region 120 of third unit cell A3 and is formed at one side end of the four bit cell. Second unit cell A2 is electrically connected to N source region 120 of fourth unit cell A4 and is formed at the other end of the four bit cell.

N drain region 125 of first unit cell A1 is spaced apart from N drain region 125 of third unit cell A3, and N drain region 125 of second unit cell A2 is spaced apart from N drain region 125 of fourth unit cell A4. Additionally, first unit cell A1 is connected to first gate 145 of third unit cell A3, and second unit cell A2 is connected to first gate 145 of fourth unit cell A4. First unit A1 and P source region 135 of second unit cell A2 are shared, and third unit cell A3 and P source region 135 of fourth unit cell A4 are shared. First unit cell A1 and floating PMOS TR of second unit cell A2 are spaced apart from third unit cell A3 and floating PMOS TR of fourth unit cell A4. The four bit cell having the above structure may include a repeating array so that a high capacity semiconductor memory device may be realized.

A case that the four bit cell operates when a voltage is applied is described as follows.

Example FIG. 6 illustrates an equivalent circuit when a semiconductor memory device in accordance with embodiments is a four bit cell.

As illustrated in example FIG. 6, shared P source region 135 of first unit cell A1 and second unit cell A2 and shared P source region 135 of third unit cell A3 and fourth unit cell A4 are connected to first bit line BL0 and second bit line BL_1, respectively. N source region 120 of first unit cell A1 and third unit cell A3 is connected to the common source line and N source region 135 of second unit cell A2 and fourth unit cell A4 is connected to the common source line. First gate 145 of first unit cell A1 and third unit cell A3 and first gate 145 of second unit cell A2 and fourth unit cell A4 are connected to first word line WL_0 and second word line WL_1, respectively.

A case that the four bit cell is programmed will be described as follows. The following bias voltage is applied to select and program first unit cell A1 among four unit cells having the above four bit cell as Table 1.

TABLE 1

| Line name | Voltage value |
| --- | --- |
| First word line (WL_0) | Second voltage (0.5 V~15 V) |
| Second word line (WL_1) | reference voltage |
| First bit line (BL_0) | First voltage (3 V~15 V) |
| Second bit line (BL_1) | reference voltage |
| Common source line (CSL) | reference voltage |
| N well (110) | First voltage (3 V~15 V) |
| P well (105) | reference voltage |

Once a bias voltage is applied, select NMOS TR and floating PMOS TR of first unit cell A1 are all turned on and due to a CHEI phenomenon, electrons are injected into second gate 155 of floating PMOS TR so that a threshold voltage becomes lowered. Therefore, a program operation is performed. In the case of second unit cell A2 and fourth unit cell A4, select NMOS TR is turned off. In the case of third unit cell A3, floating PMOS TR is turned off, so that a program operation is not performed. Accordingly, only first unit cell A1 is selectively programmed.

In the same manner, the second voltage and reference voltage are applied in combination to first word line WL_0 and second word line WL_1, and first voltage and reference voltage are applied in combination to first bit line BL_0 and second bit line BL_1, so that one of the four unit cells may be selected and programmed. For example, a second voltage applied to first word line WL_0 may be about 0.5V to about 15 V but is not limited thereto. Additionally, a first voltage applied to first bit line BL_and N well 110 may be about 3V to about 15V, but is not limited thereto.

A case in which the four bit cells are read will be described as follows. The following bias voltage is applied to select and read first unit cell A1 among four unit cells having the four bit cell as Table 2.

TABLE 2

| Line name | Voltage value |
| --- | --- |
| First word line (WL_0) | Fifth voltage (0.5 V~15 V) |
| Second word line (WL_1) | reference voltage |
| First bit line (BL_0) | Fourth voltage (0.1 V~6 V) |
| Second bit line (BL_1) | reference voltage |
| Common source line (CSL) | reference voltage |
| N well (110) | Fourth voltage (0.1 V~6 V) |
| P well (105) | reference voltage |

Once the bias voltage is applied as above, select NMOS TR of first unit cell A1 is turned on and, if floating PMOS TR is in a programmed state, floating PMOS TR is turned on, a programmed state, i.e., a "1" state, is read. If floating PMOS TR is in an un-programmed state, floating PMOS TR is turned off, an un-programmed state, i.e., a "0" state, is read. In the case of second unit cell A2 and fourth unit cell A4, select NMOS TR is turned off. In the case of third unit cell A3, floating PMOS TR is turned off, so that a read operation is not performed. Accordingly, only the first unit cell A1 is selectively read.

In the same manner, the fifth voltage and reference voltage are applied in combination to first word line WL_0 and second word line WL_1 and the fourth voltage and reference voltage are applied in combination to first bit line BL_0 and second bit line BL_1, so that the one of the four unit cells may be selected and read. For example, a fifth voltage applied to first word line WL_0 may be about 0.5V to about 15V, but is not limited thereto. Additionally, a fourth voltage applied to first bit line BL_0 and N well 110 may be about 0.1V to about 6V, but is not limited thereto.

According to embodiments, the following effects are given. First, a semiconductor memory device is realized with a single gate structure in which select NMOS TR and floating PMOS TR are connected in series, thereby minimizing its size and enhancing the degree of integration in its cell. Second, since program and read operations of a semiconductor memory device are performed stably in a low voltage environment, a peripheral circuit for driving a semiconductor memory cell may be simplified and its size may be minimized.

Example FIG. 7 illustrates semiconductor memory device 102 in accordance with embodiments. Example FIG. 8 illustrates when unit cells of semiconductor memory device 102 constitute an array. Embodiments of example FIGS. 7 and 8 can adopt the technical features of embodiments described hereinabove.

Semiconductor memory device 102 can include device isolation region 115 formed at the boundary of first conductive type well 105 and second conductive type well 110 to electrically isolate second conductive type second ion implantation region 125 from first conducive type first ion implantation region 130, first conductive type first tap region 117a formed between second conductive type second ion implantation region 125 and device isolation region 115, and second conductive type second tap region 117b formed between first conductive type first ion implantation region 130 and device isolation region 115.

In accordance with embodiments, second device isolation region 116a can be provided between second conductive type second ion implantation region 125 and first conductive type first tap region 117a. Additionally, third device isolation region 116b can be provided between first conductive type first ion implantation region 130 and second conductive type second tap region 117b.

When a high VPP voltage is applied during a program operation, latch-up may occur in which a device fails because a parasitic PNPN device is turned on through P+/N-well/P-well/N+. In accordance with embodiments, since first conductive type first tap region 117a is formed in first conductive type well 105 and second conductive type tap region 117b is formed in second conductive type well 110 on and/or over a unit cell, a latch-up phenomenon that parasitic PNPN device is tuned on through P+/N-well/P-well/N+ may be fundamentally prevented.

Example FIG. 9 illustrates semiconductor memory device 103 in accordance with embodiments. Example FIG. 10 illustrates when unit cells of semiconductor memory device 103 constitute an array. Embodiments of example FIGS. 9 and 10 can adopt the technical features of embodiments described hereinabove.

Program operation and read operations of semiconductor memory device 103 in accordance with embodiments will be described as follows. N source region 120 is connected to bit line BL and N drain region 125 is connected to P drain region 130 through additional line C. First gate 145 is connected to word lie WL, second gate 155 floats, and P source region 135 is connected to common source line CSL. Accordingly, a unit cell of semiconductor memory 103 device has a structure in which select NMOS TR of first region B and floating PMOS TR of second region D are connected in series.

When a unit cell of semiconductor memory device 103 is programmed, first voltage Vpp of positive electric potential, i.e., positive program voltage, is applied to P source region 135 and second voltage Vwlp of positive electric potential, i.e., a word line program voltage, is applied to first gate 145 connected to the word line. N source region 120 connected to the bit line and P well 105 are connected to a reference voltage. The reference voltage may include a ground (GND) or 0 Voltage, but embodiments are not limited thereto.

At this point, a first coupling capacitance exists between second gate 155 and P drain region 130, a second coupling capacitance exists between second gate 155 and P source region 135, and a third coupling capacitance exists between a channel region (between P drain region 130 and P source region 135) and second gate 155. In accordance with this bias condition, a predetermined third voltage of positive electric potential, i.e., a positive voltage occurs by the first voltage applied to N well 110 and P source region 135. Due to influence of the third voltage, floating PMOS TR of second region D is turned on and select NMOS TR of first region B is turned on by the second voltage, so that current flows from P source region 135 (i.e., the bit line) to N source region 120 (i.e., the common source line).

In this manner, if select NMOS TR of first region B and floating PMOS TR of second region D are turned on simultaneously, a Channel Hot Electron Injection (CHEI) phenomenon occurs around P source region 135 of floating PMOS TR and electrons are additionally injected on and/or over second gate 155. Consequently, a threshold voltage of floating PMOS TR becomes lowered and floating PMOS TR is turned on more strongly so that the CHEI phenomenon continues and the threshold voltage of floating PMOS TR may be continuously lowered. Accordingly, as a programming time of the semiconductor memory device is increased, a phenomenon that a threshold voltage of the floating PMOS TR of the second region D becomes lowered may be induced. Accordingly, semiconductor memory device 103 can be programmed.

Additionally, if a unit cell of semiconductor memory device 103 in accordance with embodiments is read, fourth voltage Vpr of positive potential, i.e., a positive reading voltage, is applied to P source region 135 connected to the common source line and N well 110. Fifth voltage Vwlr of positive electric potential, i.e., a word line reading voltage, is applied to first gate 145 connected to the word line. N source region 120 connected to the bit line and P well 105 are connected to a reference voltage. The reference voltage may include a ground (GND) or 0 Voltage, but embodiments are not limited thereto.

At this point, fourth voltage Vpr should be lower than first voltage Vpp. When semiconductor memory device 103 is read, the first coupling capacitance, the second coupling capacitance, and the third coupling capacitance operate, and in accordance with this bias condition, by the fourth voltage applied to N well 110 and P source region 135, a sixth voltage of positive electric potential, i.e., a positive voltage, occurs on and/or over second gate 155.

When floating PMOS TR of second region D is a programmed state, i.e., electrons are injected into second gate 155, as mentioned above, floating PMOS TR is turned on since its threshold voltage is very low and select NMOS TR is turned on by the fifth voltage also. Accordingly, since current flows from P source region 135 (i.e., the bit line) to N source region 120 (i.e., the common source line) and the current of the bit line is read, it is determined that semiconductor memory device 103 is in a programmed state (e.g., "1").

If floating PMOS TR of the second region D is in an un-programmed state, i.e., an initial state of when electrons are not injected into second gate 155, floating PMOS TR is turned off since its threshold voltage is high and current does not flow from the bit line to the common source line. Accordingly, by reading a short circuit state of the bit line, it is determined that semiconductor memory device 103 is in an un-programmed state (e.g., "0").

When semiconductor memory device 103 in accordance with embodiments is read, sizes of the first voltage and the fourth voltage may not be limited to a predetermined value but the above condition that the fourth voltage may be applied lower than the first voltage.

Example FIG. 10 illustrates when unit cells A of semiconductor memory device 103 in accordance with embodiments constitute an array.

As illustrated in example FIG. 10, unit cells A1, A2, A3, and A4 of semiconductor memory device 103 are provided in four and may have a 2×2 matrix for 4 bit cells. First unit cell A1 and second unit cell A2 adjacent on an X axis of the four bit cells and third unit cell A3 and fourth unit cell A4 have a symmetric structure facing each other. First unit cell A1 and third unit cell A3 adjacent on a Y axis and second unit cell A2 and fourth unit cell A4 have a structure in which they are arranged in parallel.

A case that the four bit cell operates when a voltage is applied is described as follows. Example FIG. 11 illustrates an equivalent circuit when semiconductor memory device 103 in accordance with embodiments consists of a four bit cell.

As illustrated in example FIG. 11, the shared P source region 135 of first unit cell A1 and second unit cell A2 and shared P source region 135 of third unit cell A3 and fourth unit cell A4 are connected to common source line CSL. N source region 120 of first unit cell A1 and third unit cell A3 is connected to first bit line BL_0 and N source region 120 of second unit cell A2 and fourth unit cell A4 is connected to second bit line BL_1. First gate 145 of first unit cell A1 and third unit cell A3 and first gate 145 of second unit cell A2 and fourth unit cell A4 are connected to first word line WL_0 and second word line WL_1, respectively.

A case that the four bit cell is programmed will be described. The following bias voltage is applied to select and program first unit cell A1 among four unit cells constituting the above four bit cell as Table 3.

TABLE 3

| Line name | Voltage value |
| --- | --- |
| First word line (WL_0) | Second voltage (0.5 V~15 V) |
| Second word line (WL_1) | reference voltage |
| First bit line (BL_0) | reference voltage |
| Second bit line (BL_1) | First voltage (3 V~15 V) |
| Common source line (CSL) | First voltage (3 V~15 V) |
| N well (110) | First voltage (3 V~15 V) |
| P well (105) | reference voltage |

Once a bias voltage is applied, select NMOS TR and floating PMOS TR of first unit cell A1 are all turned on, and due to a CHEI phenomenon, electrons are injected into second gate 155 of floating PMOS TR so that a threshold voltage becomes lowered. Therefore, a program operation is performed. In the case of second unit cell A2 and fourth unit cell A4, select NMOS TR is turned off. In the case of third unit cell A3, floating PMOS TR is turned off, so that a program operation is not performed. Accordingly, only first unit cell A1 is selectively programmed.

In the same manner, the second voltage and reference voltage are applied in combination to first word line WL_0 and second word line WL_1, and the first voltage and reference voltage are applied in combination to first bit line BL_0 and second bit line BL_1, so that one of the four unit cells may be selected and programmed. For example, a second voltage applied to first word line WL_0 may be about 0.5V to about 15V, but is not limited thereto. Additionally, a first voltage applied to common source line CSL and N well 110 may be about 3V to about 15V, but is not limited thereto.

A case that the four bit cells are read will be described. The following bias voltage is applied to select and read first unit cell A1 among four unit cells constituting the four bit cell as Table 4.

TABLE 4

| Line name | Voltage value |
| --- | --- |
| First word line (WL_0) | Fifth voltage (0.5 V~15 V) |
| Second word line (WL_1) | reference voltage |
| First bit line (BL_0) | reference voltage |
| Second bit line (BL_1) | Fourth voltage (0.1 V~6 V) |
| Common source line (CSL) | Fourth voltage (0.1 V~6 V) |
| N well (110) | Fourth voltage (0.1 V~6 V) |
| P well (105) | reference voltage |

Once the bias voltage is applied as above, select NMOS TR of first unit cell A1 is turned on and, if floating PMOS TR is in a programmed state, floating PMOS TR is turned on, a programmed state, i.e., a "1" state, is read. If floating PMOS TR is in an un-programmed state, floating PMOS TR is turned off, an un-programmed state, i.e., a "0" state, is read. In the case of second unit cell A2 and fourth unit cell A4, select NMOS TR is turned off. In the case of third unit cell A3, floating PMOS TR is turned off, so that a read operation is not performed. Accordingly, only first unit cell A1 is selectively read.

In the same manner, the fifth voltage and reference voltage are applied in combination to first word line WL_0 and second word line WL_1 and the fourth voltage and reference voltage are applied in combination to first bit line BL_0 and second bit line BL_1, so that the one of the four unit cells may be selected and read. For example, a fifth voltage applied to first word line WL_0 may be about 0.5V to about 15V, but is not limited thereto. Additionally, a fourth voltage applied to second bit line BL_1, common source line CSL, and N well 110 may be about 0.1V to about 6V, but is not limited thereto.

Example FIG. 12 illustrates semiconductor memory device 104 in accordance with embodiments. Example FIG. 13 illustrates when unit cells of semiconductor memory device 104 in accordance with embodiments constitute an array. Embodiments of example FIGS. 12 and 13 can adopt the technical features of embodiments described hereinabove.

In accordance with embodiments, semiconductor memory device 104 can include device isolation region 115 formed at the boundary of first conductive type well 105 and second conductive type well 110 to electrically isolate second conductive type second ion implantation region 125 from first conducive type first ion implantation region 130, first conductive type first tap region 117a formed between second conductive type second ion implantation region 125 and device isolation region 115, and second conductive type second tap region 117b formed between first conductive type first ion implantation region 130 and device isolation region 115.

Embodiments can include second device isolation region 116a between second conductive type second ion implantation region 125 and first conductive type first tap region 117a. Additionally, third device isolation region 116b can be included between first conductive type first ion implantation region 130 and second conductive type second tap region 117b.

When a high VPP voltage is applied during a program operation, latch-up may occur in which a device fails because a parasitic PNPN device is turned on through P+/N-well/P-well/N+. In accordance with embodiments, since first conductive type first tap region 117a is formed in first conductive type well 105 and second conductive type tap region 117b is formed in second conductive type well 110 on and/or over a unit cell, a latch-up phenomenon that a parasitic PNPN device is tuned on through P+/N-well/P-well/N+ may be fundamentally prevented.

In accordance with embodiments, the following effects are given. First, a semiconductor memory device is realized having a single gate structure in which select NMOS TR and floating PMOS TR are connected in series, thereby minimizing its size and enhancing the degree of integration in its cell. Secondly, since program and read operations of a semiconductor memory device are performed stably in a low voltage environment, a peripheral circuit for driving a semiconductor memory cell may be simplified and its size may be minimized. Third, since a first conductive type first tap region is formed in a first conductive type well and a second conductive type tap region is formed in a second conductive type well on a unit cell, a latch-up phenomenon that a parasitic PNPN device is tuned on may be fundamentally prevented.

As illustrated in example FIGS. 14 to 23, a method of manufacturing a semiconductor memory device in accordance with embodiments will be described. Although, descriptions of example FIGS. 14 to 23 are provided based on embodiments illustrated in example FIGS. 7 and 8, embodiments are not limited thereto.

Figure 14:
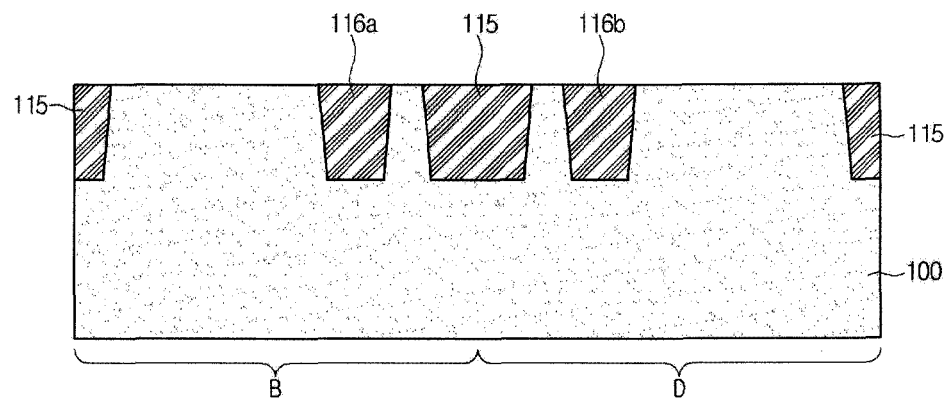

As illustrated in example FIG. 14, device isolation regions 115, 116a, and 116b are formed in semiconductor substrate 100. Semiconductor substrate 100 may be implanted with a first conductive type ion but is not limited thereto. For example, semiconductor substrate 100 may be a P-type doped substrate but is not limited thereto. The device isolation region may include first device isolation region 115, second device isolation region 116a, and third device isolation layer 116b, but is not limited thereto. For example, first device isolation layer 115 can be formed at the boundary of first conductive type well 105 formed later and second conductive type well 110. Additionally, second device isolation region 116a can be formed between second conductive type second ion implantation region 125 and first conductive type first tap region 117a, formed later. Third device isolation region 116b can be formed between first conductive type first ion implantation region 130 and second conductive type second tap region 117b.

Figure 15:
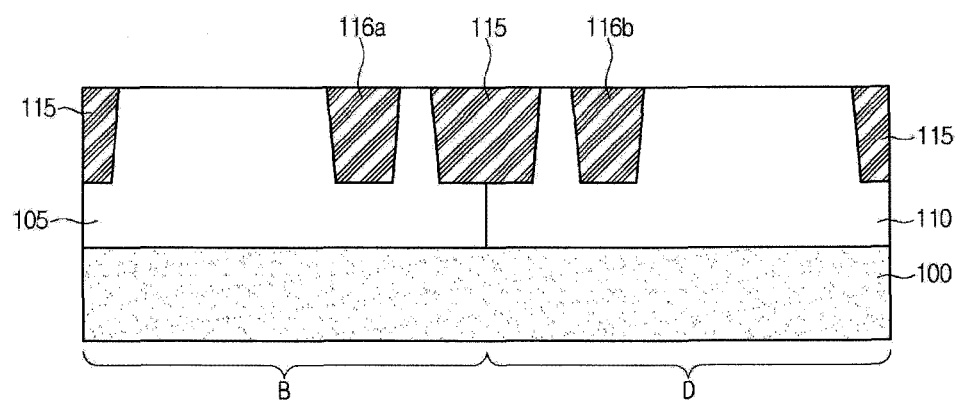

As illustrated in example FIG. 15, next first conductive type cell 105 and second conductive type well 110 are formed in semiconductor substrate 100. For example, P well 105 and N well 110 may be formed in a region where select NMOS TR and floating PMOS TR are to be formed, but embodiments are not limited thereto.

Figure 16:
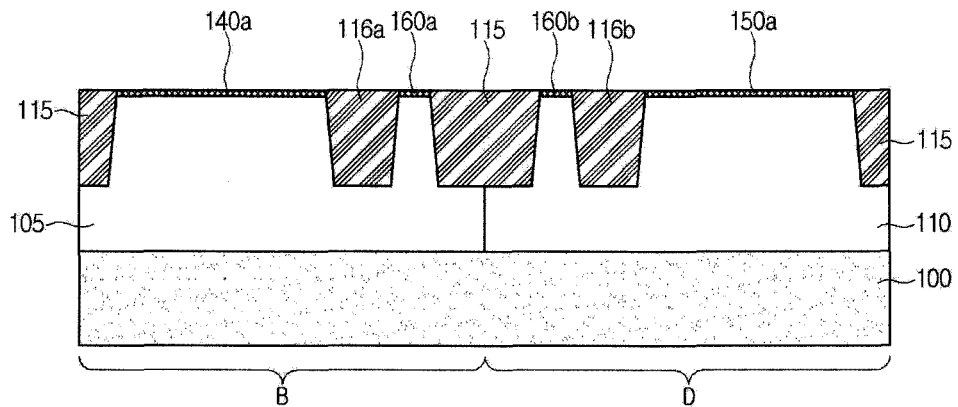

As illustrated in example FIG. 16, next gate insulators of select NMOS TR and floating PMOS TR can be formed. For example, the gate insulator can include first gate insulator 140a for select NMOS TR, second gate insulator 150a for floating PMOS TR, third gate insulator 160a on and/or over first conductive type first tap region 117a, and fourth gate insulator 160b on and/or over second conductive type second tap region 117b. Third gate insulator 160a and fourth gate insulator 160b can be removed during the next process. The gate insulator may be formed with about 50 Å to about 200 Å, but is not limited thereto. First gate insulator 140a to fourth gate insulator 160b can be formed simultaneously, but are not limited thereto. First gate insulator 140a and second gate insulator 150a can be substantially formed with the same thickness, but are not limited thereto.

Figure 17:
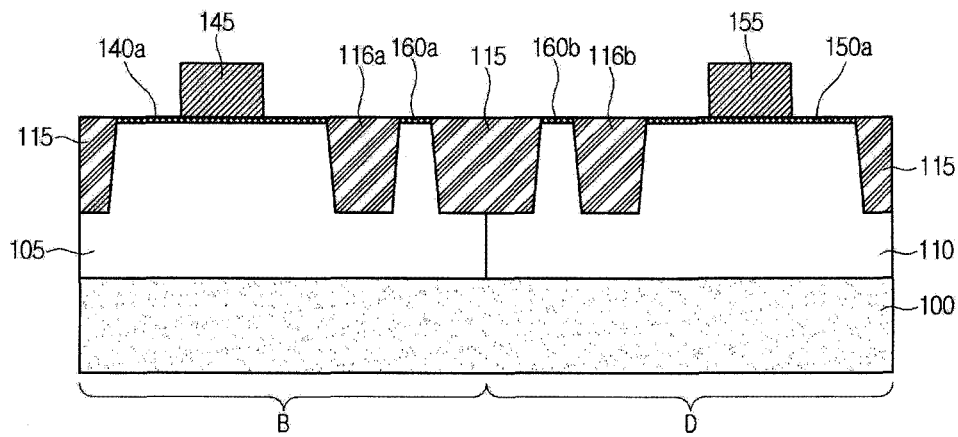

As illustrated in example FIG. 17, first gate 145 and second gate 155 are formed on and/or over first conductive type well 105 and second conductive type well 110, respectively. For example, through a gate process, select gate (SG) 145 is formed on and/or over P well 105 and floating gate (FG) 155 is formed on and/or over N well 110.

Figure 18:
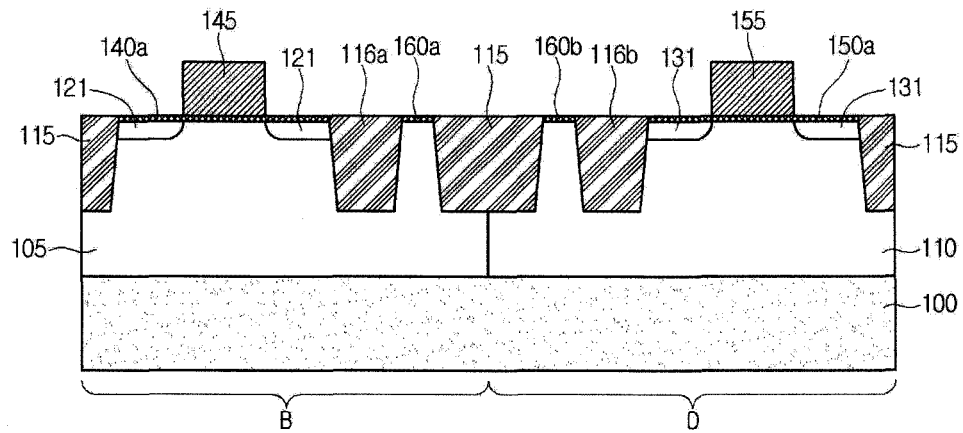

As illustrated in example FIG. 18, next second conductive type S/D extension region 121 is formed in semiconductor substrate 100 at both sides of first gate 145, and first conductive type S/D extension region 131 is formed in semiconductor substrate 100 at both sides of the second gate. For example, N-type S/D Extension regions NLDD 121 are formed at both sides of select gate 145 and P-type S/D Extension regions PLDD 131 are formed at both sides of floating gate 155, but embodiments are not limited thereto. Some portions of second conductive type S/D extension region 121 and first conductive type S/D extension region 131 can be formed, or alternatively, both of them may not be formed. Additionally, in accordance with embodiments, an additional P-type impurity injection process can be performed instead of PLDD 131 in order to enhance program efficiency by maximizing CHEI effects of floating PMOS TR. For example, a CSD (i.e., Cell S/D) implant process can be performed.

Figure 19:
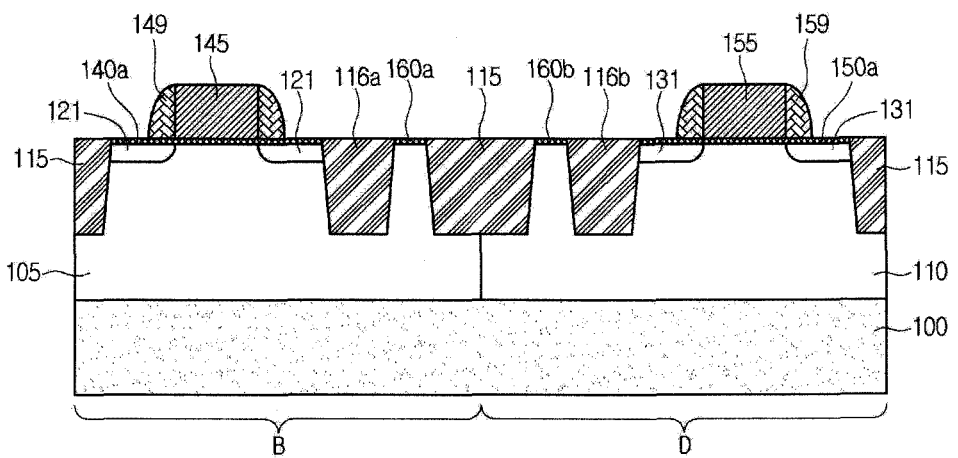

As illustrated in example FIG. 19, next first spacers 149 can be formed at both sides of first gate 145 and second spacers 159 can be formed at both sides of second gate 155, but embodiments are not limited thereto.

Figure 20:
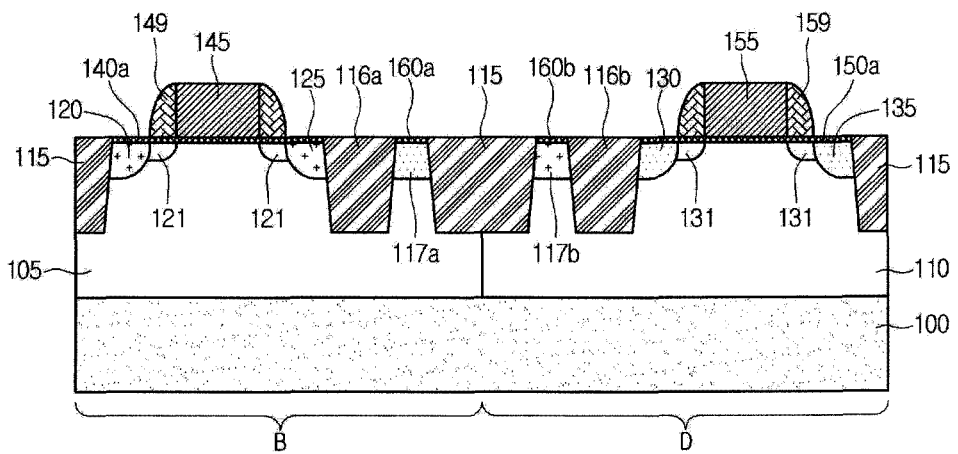

As illustrated in example FIG. 20, next second conductive type first ion implantation region 120 can be formed in first conductive type well 105 at one side of first gate 145 and second ion implantation region 125 can be formed in first conductive type well 105 at the other side of first gate 145. First conductive type first ion implantation region 130 can be formed in second conductive type well 110 at one side of the second gate 155 and first conductive type second ion implantation region 135 can be formed in second conductive type 110 at the other side of second gate 155. Additionally, second conductive type second tap region 117b can be formed between first conductive type first ion implantation region 130 and first device isolation region 115. Second conductive type second tap region 117b can be formed between first device isolation region 115 and third device isolation region 116b, but embodiments are not limited thereto.

Second conductive type first ion implantation region 120, second conductive type second ion implantation region 125, and the second conductive type second tap region are formed simultaneously, but embodiments are not limited thereto. First conductive type first tap region 117a can be formed between second conductive type second ion implantation region 125 and first conductive type first tap region 117a can be formed between first device isolation region 115 and second device isolation region 116a, but embodiments are not limited thereto.

First conductive type first ion implantation region 130, first conductive type second ion implantation region 135, and first conductive type first tap region 117a can be simultaneously formed, but embodiments are not limited thereto. For example, source region 120 and drain region 125 of select NMOS TR are formed through an N-type impurity injection process, and N-type well tap 117b can be formed in N well 110 simultaneously. Additionally, source region 135 and drain region 139 of floating PMOS TR are formed through a P-type impurity injection process, and P-type well tab 117a can be formed in P well 105 simultaneously.

In accordance with embodiments, since first conductive type first tap region 117a is formed in a first conductive type well 105 and second conductive type tap region 117b is formed in second conductive type well 110 on and/or over a unit cell, a latch-up phenomenon that a parasitic PNPN device is tuned on through P+/N-well/P-well/N+ may be fundamentally prevented.

Figure 21:
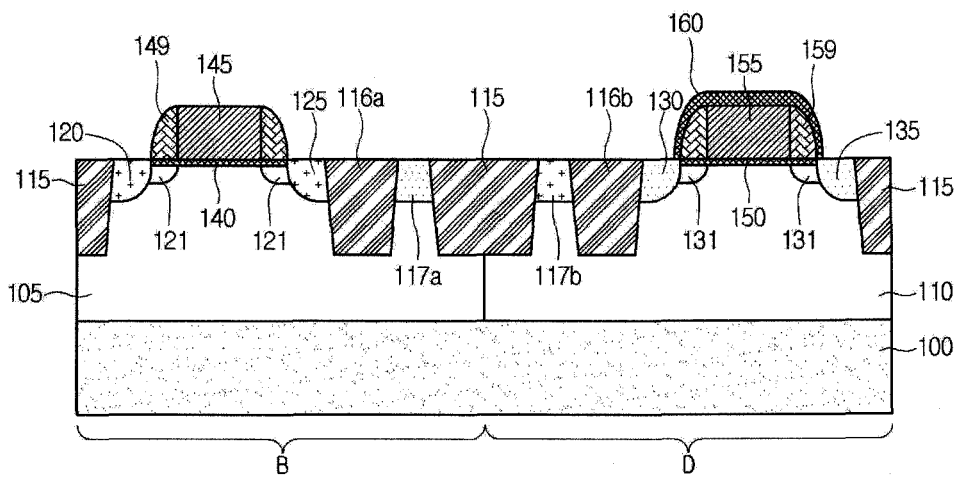

As illustrated in example FIG. 21, next silicide blocking layer 160 can be formed on and/or over second gate 155. For example, silicide blocking layer 160 can be formed on and/or over the floating gate in order to enhance charge retention characteristic. Silicide blocking layer 160 can have a sandwich structure including a combination of an oxide layer (SiO2), a nitride layer (SiN), and an oxynitride layer (SiON). Moreover, if retention characteristic is sufficiently obtained, silicide blocking layer 160 may not be formed.

Figure 22:
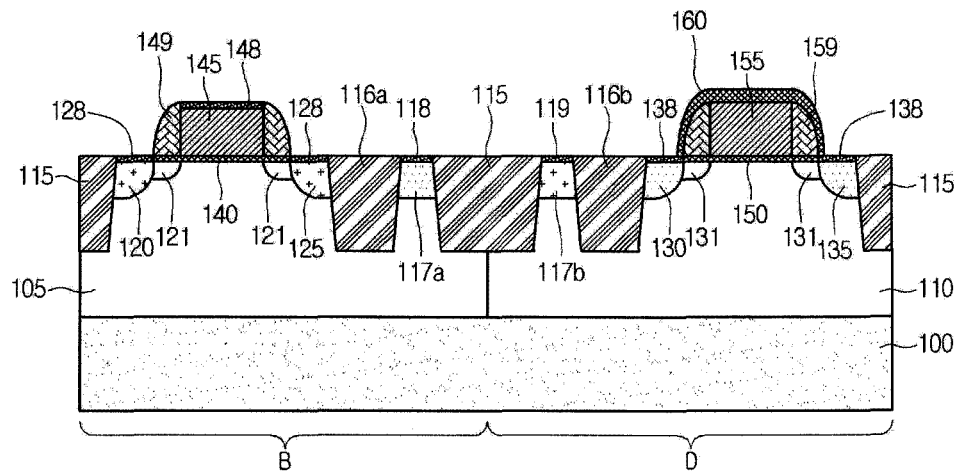

As illustrated in example FIG. 22, next silicide may be formed. Before the silicide process, third gate insulation layer 160a and fourth gate insulation layer 160b can be removed. Also, before the silicide process, first gate insulation layers 140a at both sides of first gate 145 and second gate insulation layer 150a at both sides of second gate 155 can be removed. The silicide can include first silicide 148, second silicide 128, third silicide 138, fourth silicide 118, and fifth silicide 119. For example, first silicide 148 can be formed on and/or over first gate 145. Additionally, second silicide 128 can be formed on and/or over second conductive type first ion implantation region 120 and second conductive type second ion implantation region 125. Moreover, third silicide 138 can be formed on and/or over first conductive type first ion implantation region 130 and first conductive type second ion implantation region 135. Furthermore, fourth silicide 118 can be formed on and/or over first conductive type first tap region 117a and fifth silicide 119 can be formed on and/or over second conductive type second tap region 117b, but embodiments are not limited thereto. In addition, if silicide blocking layer 160 is formed on and/or over floating gate 155, silicide may not be formed on and/or over floating gate 155.

Figure 23:
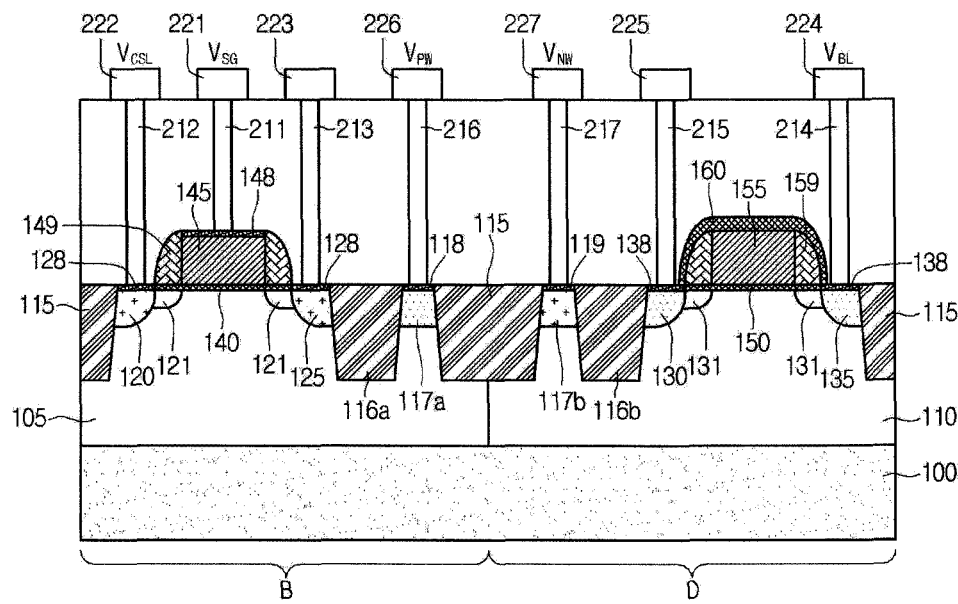

As illustrated in example FIG. 23, next a contact formation process, an interlayer insulation layer formation process using PMD or ILD, and a metal formation process are performed. For example, first contact 211 can be formed on and/or over first gate 145. Additionally, second contact 212 and third contact 213 can be formed on and/or over second conductive type first ion implantation region 120 and second conductive type second ion implantation region 125, respectively. Furthermore, fourth contact 214 and fifth contact 215 can be formed on and/or over first conductive type ion implantation region 135 and first conductive type first ion implantation region 130, respectively. Furthermore, fifth contact 216 and sixth contact 217 can be formed on and/or over first conductive type first tap region 117a and second conductive type second tap region 117b, respectively, but embodiments are not limited thereto. Metal can be formed on and/or over the contact. The metal may include first metal 221, second metal 222, third metal 223, fourth metal 224, fifth metal 225, sixth metal 226 and seventh metal 227. First metal 221 to seventh metal 227 can be formed on and/or over first contact 211 to seventh contact 217, respectively.

Through this contact and metal process, electrons are formed on and/or over source 120 and gate 145 of select NMOS TR, source 135 of floating PMOS TR, P well tab 117a, and N well tab 117b, and drain 125 of select NMOS TR is electrically connected to drain 130 of floating PMOS TR through line C.

In accordance with embodiments, the following effects are given. First, a semiconductor memory device is realized having a single gate structure in which select NMOS TR and floating PMOS TR are connected in series, thereby minimizing its size and enhancing the degree of integration in its cell. Second, since program and read operations of a semiconductor memory device are performed stably in a low voltage environment, a peripheral circuit for driving a semiconductor memory cell may be simplified and its size may be minimized. Third, since a first conductive type first tap region is formed in a first conductive type well and a second conductive type tap region is formed in a second conductive type well on and/or over a unit cell, a latch-up phenomenon that a parasitic PNPN device is tuned on may be fundamentally prevented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
   a first conductive type well and a second conductive type well disposed on a semiconductor substrate;
   a first gate and a second gate disposed on the first conductive type well and the second conductive type well, respectively;
   a second conductive type first ion implantation region disposed in the first conductive type well at a first side of the first gate;
   a second conductive type second ion implantation region disposed in the first conductive type well at a second side of the first gate opposite to the first side of the first gate;
   a first conductive type first ion implantation region disposed in the second conductive type well at a first side of the second gate;
   a first conductive type second ion implantation region disposed in the second conductive type well at a second side of the second gate opposite to the first side of the second gate; and
   a line electrically connecting the second conductive type second ion implantation region to the first conductive type first ion implantation region,
   wherein the first conductive type well, the first gate, the second conductive type first ion implantation region, and the second conductive type second ion implantation region collectively form a second conductive type select transistor and the second conductive type well, the second gate, the first conductive type first ion implantation region, and the first conductive type second ion implantation region collectively form a first conductive type floating transistor, wherein:
   the second conductive type first ion implantation region is connected to a common source line;
   the second conductive type second ion implantation region is connected to the first conductive type first ion implantation region;
   the first gate is connected to a word line;
   the first conductive type second ion implantation region is connected to a bit line;
   the second gate floats;
   a first voltage serving as a positive program voltage of positive potential is applied to the hit line and the second conductive well;
   a second voltage serving as a word line program voltage of positive potential is applied to the word line; and
   the common source line and the first conductive type well are connected to a reference voltage and programmed.

2. The semiconductor memory device of claim 1, further comprising:
   a device isolation region disposed at a boundary between the first conductive type well and the second conductive type well to electrically insulate the second conductive type second ion implantation region from the first conductive type first ion implantation region;
   a first conducive type first tap region disposed between the second conductive type second ion implantation region and the device isolation region; and
   a second conductive type second tap region disposed between the first conductive type first ion implantation region and the device isolation region.

3. The semiconductor memory device of claim 1, further comprising:
   a device isolation layer configured to one of isolate the first conductive type well from the second conductive well and disposed at an upper boundary portion between the first conductive type well and the second conductive type well to isolate the second conductive type first ion implantation region and the second conductive type second ion implantation region from the first conductive type first ion implantation region and the first conductive type second ion implantation region.

4. The semiconductor memory device of claim 1, further comprising:
   at least one input terminal serving as an electrode when voltage is applied and is disposed on at least one of the second conductive type first ion implantation region, the second conductive type second ion implantation region, the first conductive type first ion implantation region, and the first conductive type second ion implantation region.

5. The semiconductor memory device of claim 1, wherein:
   the second conductive type first ion implantation region is connected to a common source line;
   the second conductive type second ion implantation region is connected to the first conductive type second ion implantation region;

the first gate is connected to a word line;
the first conductive type first ion implantation region is connected to a bit line; and
the second gate floats.

6. The semiconductor memory device of claim 1, wherein:
the second conductive type second ion implantation region is connected to a common source line;
the second conductive type first ion implantation region is connected to the first conductive type first ion implantation region;
the first gate is connected to a word line;
the first conductive type second ion implantation region is connected to a bit line; and
the second gate floats.

7. The semiconductor memory device of claim 1, wherein:
the second conductive type second ion implantation region is connected to a common source line;
the second conductive type first ion implantation region is connected to the first conductive type second ion implantation region;
the first gate is connected to a word line;
the first conductive type first ion implantation region is connected to a bit line; and
the second gate floats.

8. The semiconductor memory device of claim 5, wherein:
a first voltage serving as a positive program voltage of positive potential is applied to the bit line and the second conductive type well;
a second voltage serving as a word line program voltage of positive potential is applied to the word line; and
the common source line and the first conductive type well are connected to a reference voltage and programmed.

9. The semiconductor memory device of claim 6, wherein:
a first voltage serving as a positive program voltage of positive potential is applied to the bit line and the second conductive type well;
a second voltage serving as a word line program voltage of positive potential is applied to the word line; and
the common source line and the first conductive type well are connected to a reference voltage and programmed.

10. The semiconductor memory device of claim 7, wherein:
a first voltage serving as a positive program voltage of positive potential is applied to the bit line and the second conductive type well;
a second voltage serving as a word line program voltage of positive potential is applied to the word line; and
the common source line and the first conductive type well are connected to a reference voltage and programmed.

11. The semiconductor memory device of claim 1, wherein:
a fourth voltage serving as a positive reading voltage of positive potential is applied to the bit line and the second conductive type well;
a fifth voltage serving as a word line reading voltage of positive potential is applied to the word line; and
the common source line and the first conductive type well are connected to a reference voltage and read.

12. The semiconductor memory device of claim 5, wherein;
a fourth voltage serving as a positive reading voltage of positive potential is applied to the bit line and the second conductive type well;
a fifth voltage serving as a word line reading voltage of positive potential is applied to the word line; and
the common source line and the first conductive type well are connected to a reference voltage and read.

13. The semiconductor memory device of claim 6, wherein:
a fourth voltage serving as a positive reading voltage of positive potential is applied to the bit line and the second conductive type well;
a fifth voltage serving as a word line reading voltage of positive potential is applied to the word line; and
the common source line and the first conductive type well are connected to a reference voltage and read.

14. The semiconductor memory device of claim 7, wherein:
a fourth voltage serving as a positive reading voltage of positive potential is applied to the bit line and the second conductive type well;
a fifth voltage serving as a word line reading voltage of positive potential is applied to the word line; and
the common source line and the first conductive type well are connected to a reference voltage and read.

15. The semiconductor memory device of claim 1, further comprising:
a device isolation region disposed at a boundary between the first conductive type well and the second conductive type well to electrically isolate the second conductive type second ion implantation region from the first conductive type first ion implantation region;
a first conductive type first tap region disposed between the second conductive type second ion implantation region and the device isolation region; and
a second conductive type second tap region disposed between the first conductive type first ion implantation region and the device isolation region.

16. The semiconductor memory device of claim 5, further comprising:
a device isolation region disposed at a boundary between the first conductive type well and the second conductive type well to electrically isolate the second conductive type second ion implantation region from the first conductive type first ion implantation region;
a first conductive type first tap region disposed between the second conductive type second ion implantation region and the device isolation region; and
a second conductive type second tap region disposed between the first conductive type first ion implantation region and the device isolation region.

17. The semiconductor memory device of claim 6, further comprising:
a device isolation region disposed at a boundary between the first conductive type well and the second conductive type well to electrically isolate the second conductive type second ion implantation region from the first conductive type first ion implantation region;
a first conductive type first tap region disposed between the second conductive type second ion implantation region and the device isolation region; and
a second conductive type second tap region disposed between the first conductive type first ion implantation region and the device isolation region.

18. The semiconductor memory device of claim 7, further comprising:
a device isolation region disposed at a boundary between the first conductive type well and the second conductive type well to electrically isolate the second conductive type second ion implantation region from the first conductive type first ion implantation region;
a first conductive type first tap region disposed between the second conductive type second ion implantation region and the device isolation region; and a second conductive type second tap region disposed between the first conductive type first ion implantation region and the device isolation region.

\* \* \* \* \*